(12) United States Patent
Stracovsky et al.

(10) Patent No.: US 8,495,464 B2
(45) Date of Patent: Jul. 23, 2013

(54) RELIABILITY SUPPORT IN MEMORY SYSTEMS WITHOUT ERROR CORRECTING CODE SUPPORT

(75) Inventors: Henry Stracovsky, Portland, OR (US); Michael Espig, Newberg, OR (US); Victor W. Lee, Santa Clara, CA (US); Daehyun Kim, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 447 days.

(21) Appl. No.: 12/824,299

(22) Filed: Jun. 28, 2010

(65) Prior Publication Data

US 2011/0320913 A1   Dec. 29, 2011

(51) Int. Cl.
*G11C 29/00* (2006.01)
*G06F 11/00* (2006.01)

(52) U.S. Cl.
USPC ........... 714/763; 714/764; 714/768; 714/718; 714/799; 714/6.24; 714/42; 714/48; 345/555; 345/530; 365/185.09; 365/201

(58) Field of Classification Search
USPC .................. 714/763, 764, 768, 718, 6.24, 42, 714/48; 345/555, 530; 365/185.09, 201
See application file for complete search history.

(56) References Cited

U.S. PATENT DOCUMENTS

| 5,001,418 | A | * | 3/1991 | Posse et al. ................. 324/73.1 |
|---|---|---|---|---|
| 5,200,962 | A | | 4/1993 | Kao et al. |
| 5,237,460 | A | * | 8/1993 | Miller et al. ....................... 360/8 |
| 5,293,388 | A | | 3/1994 | Monroe et al. |
| 5,463,700 | A | | 10/1995 | Nakazawa |
| 6,076,063 | A | * | 6/2000 | Unno et al. .................... 704/500 |
| 6,104,417 | A | * | 8/2000 | Nielsen et al. ................ 345/542 |
| 7,340,666 | B1 | * | 3/2008 | Wright et al. ................. 714/774 |
| 7,506,226 | B2 | * | 3/2009 | Gajapathy et al. ............ 714/718 |
| 7,624,328 | B2 | * | 11/2009 | Unruh .............................. 714/763 |
| 7,877,665 | B2 | * | 1/2011 | Mokhlesi ....................... 714/763 |
| 8,230,300 | B2 | * | 7/2012 | Perlmutter et al. ........... 714/763 |
| 8,261,174 | B2 | * | 9/2012 | Lastras-Montano .......... 714/799 |
| 2004/0199854 | A1 | * | 10/2004 | Urata et al. .................... 714/763 |
| 2008/0062775 | A1 | * | 3/2008 | Oh ............................. 365/189.05 |
| 2009/0158125 | A1 | * | 6/2009 | Harada et al. ................. 714/764 |
| 2010/0103183 | A1 | * | 4/2010 | Lin et al. ........................ 345/555 |
| 2010/0281340 | A1 | * | 11/2010 | Franceschini et al. ........ 714/763 |
| 2011/0154160 | A1 | * | 6/2011 | Yurzola et al. ................ 714/763 |
| 2011/0246703 | A1 | * | 10/2011 | Franceschini et al. ........ 711/103 |
| 2011/0314231 | A1 | * | 12/2011 | O'Connor ..................... 711/154 |

OTHER PUBLICATIONS

Int'l Search Report and Written Opinion for Int'l Patent Application No. PCT/US2011/042020 mailed Feb. 20, 2012, 8 pgs.

\* cited by examiner

*Primary Examiner* — John J Tabone, Jr.
(74) *Attorney, Agent, or Firm* — Blakely, Sokoloff, Taylor & Zafman LLP

(57) ABSTRACT

Methods and apparatuses for error correction. A N-bit block data to be stored in a memory device is received. The memory device does not perform any error correction code (ECC) algorithm nor provide designated error correction code storage for the N-bit block of data. Data compression is applied to the N-bit data to compress the block of data to generate a M-bit compressed block of data. A K-bit ECC is computed for the M-bit compressed data, wherein M+K is less than or equal to N. The M-bit compressed data and the K-bit ECC are stored together in the memory device.

14 Claims, 5 Drawing Sheets

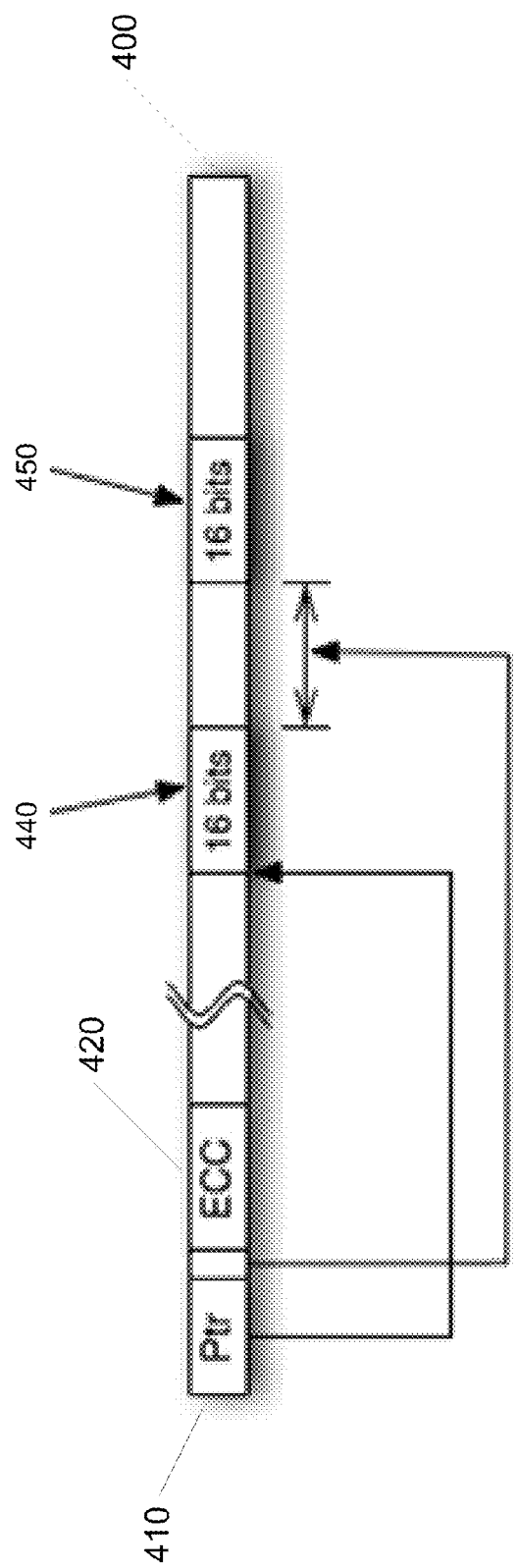

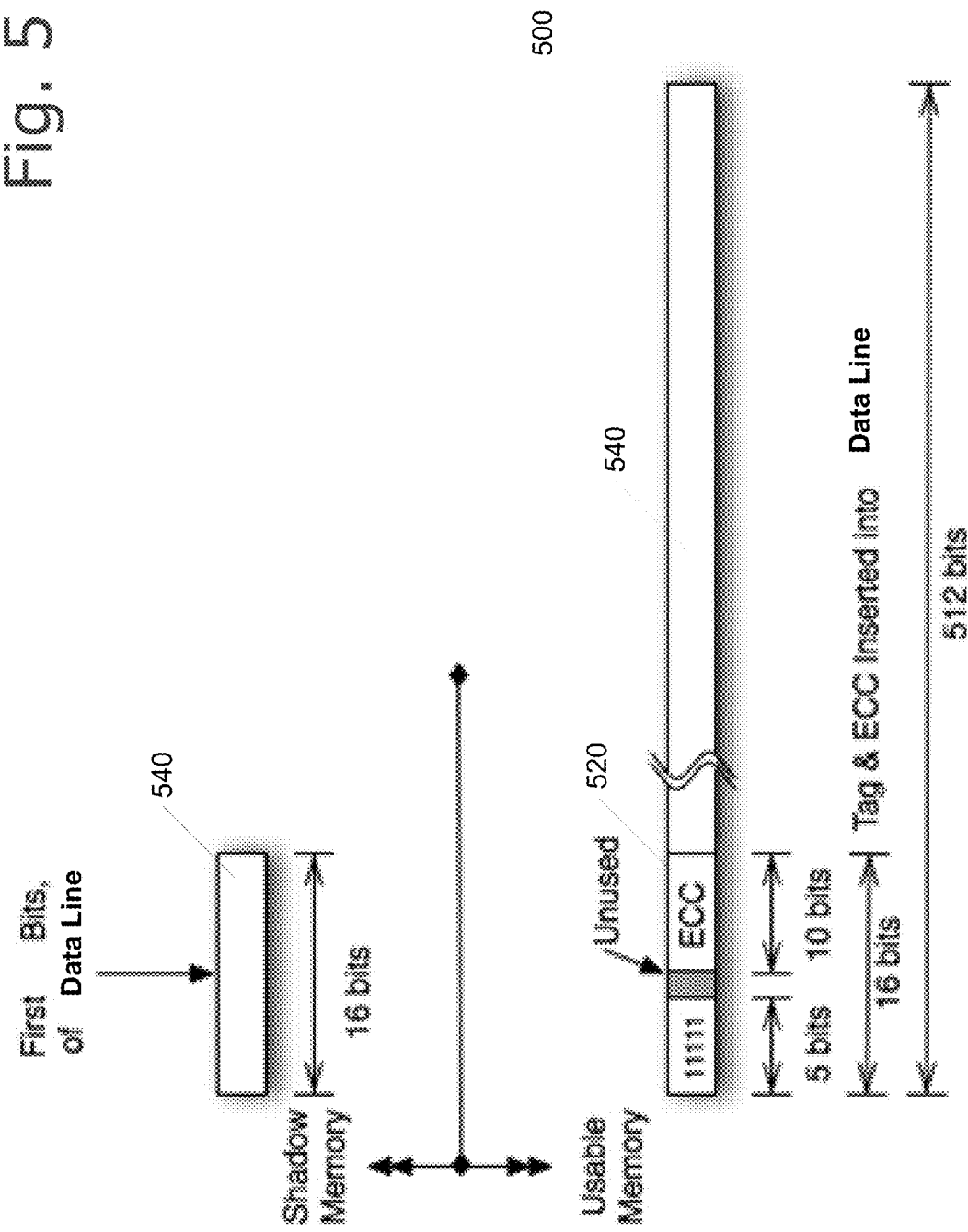

RELIABILITY SUPPORT IN MEMORY SYSTEMS WITHOUT ERROR CORRECTING CODE SUPPORT

TECHNICAL FIELD

Embodiments of the invention relate to memory systems in electronic devices. More particularly, embodiments of the invention relate to techniques to provide reliability support in memory devices that do not support error correcting code (ECC).

BACKGROUND

Reliable system architecture is critical to many High Performance Computing (HPC) workloads. For example, modern graphics processing units (GPUs) with high compute density are suitable for HPC workloads except that the graphics memory subsystem (e.g., GDDR) does not support features to meet the reliability needs. Common failures in the memory subsystem include transient faults (TFs) and silent data corruption (SDC).

Augmenting the memory subsystem to make it reliable would require a change to an industry standard and cooperation from memory vendors. This augmentation would result in a more complex and more expensive system.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4 is a conceptual diagram of one embodiment of a compressible memory line.

FIG. 5 is a conceptual diagram of one embodiment of an uncompressible memory line.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

The description provided herein includes a solution to protect a memory system (e.g., a graphics memory subsystem) from silent data corruption (SDC) without changing the memory array—thus bypassing the need to alter any specification or require changes to the memory array design. One embodiment includes at least memory compression to provide enough space for adding Error Correction Codes (ECC) to cache lines. This scheme would protect the memory array from SDC with a relatively small performance impact.

The description herein provides techniques and mechanisms for using various compression schemes to support HPC reliability requirements for memory transactions. In various embodiments, the techniques and mechanisms compress a high percentage of memory transactions to provide an adequate number of available bits within the data portion of the memory transaction to support error detection and correction on both the address and data portions. Note that it may not be the goal to get the best compression rate possible but instead to get the best compression coverage (largest percentage of memory) providing just enough free bits to implement the reliability algorithms.

Similarly, since workload performance may be paramount, developing a simple, low-latency implementation is also considered. In one embodiment, the memory subsystem and associated controllers operate as follows: for memory writes, the memory transaction is compressed, the error check code is placed in the new available bits and the transaction is written to memory. Similarly, for reads, the error check code is read and verified against the address and data, then the remaining data is uncompressed and presented to the processing cluster.

Various error checking techniques may be used to provide sufficient coverage. However, the type of error checking technique does determine the amount of compression required and will affect the number of compressible lines. In this description an example compression and error checking scheme that utilizes 12 bits for the error check code is used; however, other schemes may also be used. The number of bits, the compression scheme and the error check algorithm may vary according to the environment or subsystem in which it is applied.

In one embodiment, the following components may be utilized: a compressor/decompressor to perform compression on a memory transaction, a memory controller to support reading and writing of uncompressible memory transactions and associated error check codes, and local storage structures for uncompressible memory transactions and error check codes.

Figure 1:
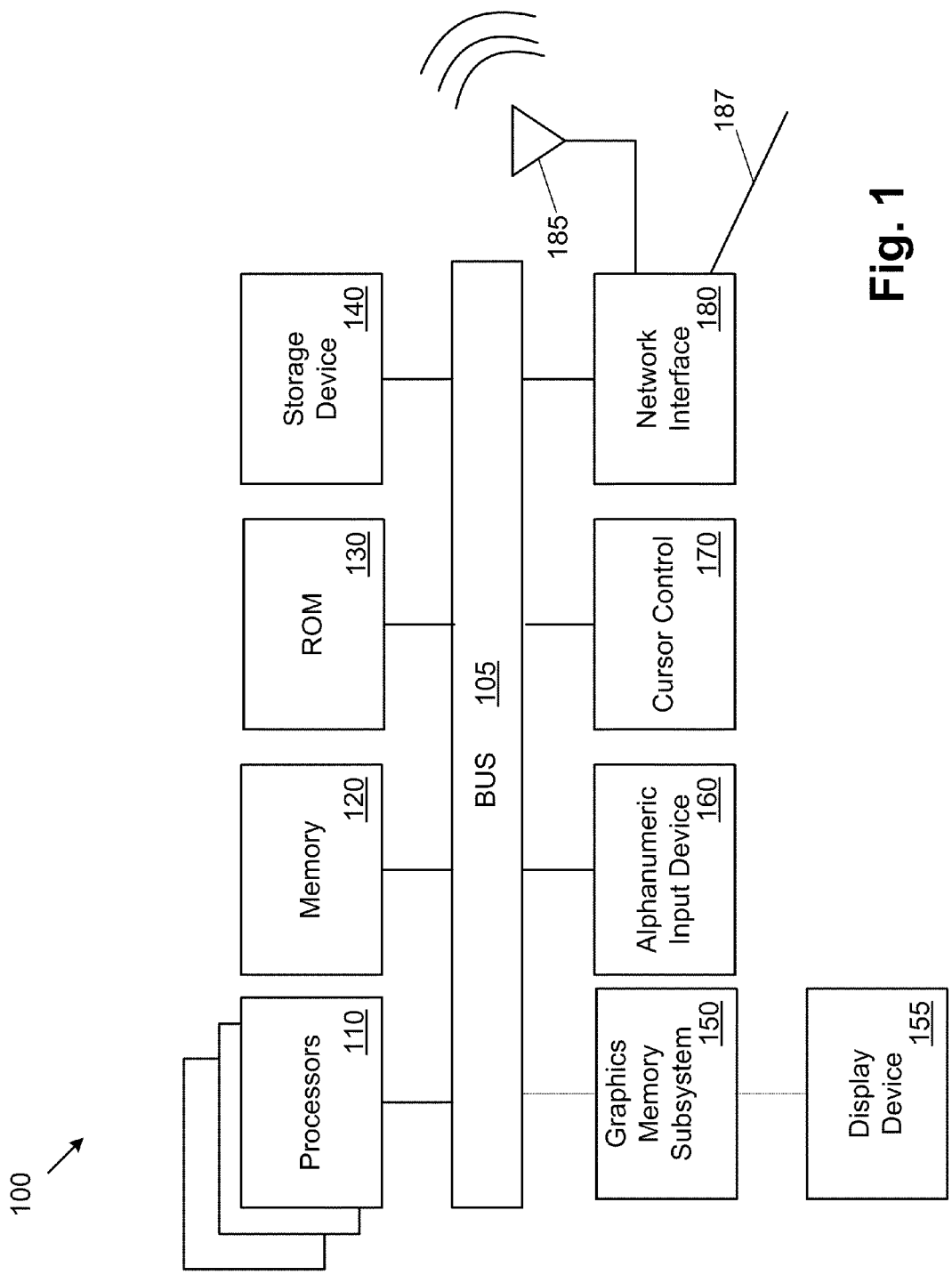
FIG. 1 is a block diagram of one embodiment of an electronic system.

The memory subsystem to which reliability support techniques may be applied may reside in an electronic system. FIG. 1 is a block diagram of one embodiment of an electronic system. The electronic system illustrated in FIG. 1 is intended to represent a range of electronic systems (either wired or wireless) including, for example, desktop computer systems, laptop computer systems, cellular telephones, personal digital assistants (PDAs) including cellular-enabled PDAs, set top boxes. Alternative electronic systems may include more, fewer and/or different components.

Electronic system 100 includes bus 105 or other communication device to communicate information, and processor 110 coupled to bus 105 that may process information. While electronic system 100 is illustrated with a single processor, electronic system 100 may include multiple processors and/or co-processors. Electronic system 100 further may include random access memory (RAM) or other dynamic storage device 120 (referred to as memory), coupled to bus 105 and may store information and instructions that may be executed by processor 110. Memory 120 may also be used to store temporary variables or other intermediate information during execution of instructions by processor 110. In one embodiment, memory 120 may support the reliability techniques described herein. In alternate embodiments, specific memory subsystems (e.g., graphics memory subsystem) may support the reliability techniques described herein.

Electronic system 100 may also include read only memory (ROM) and/or other static storage device 130 coupled to bus 105 that may store static information and instructions for processor 110. Data storage device 140 may be coupled to bus 105 to store information and instructions. Data storage device 140 such as a magnetic disk or optical disc and corresponding drive may be coupled to electronic system 100.

Electronic system 100 may also be coupled via bus 105 and graphics memory subsystem 150 to display device 155, such as a cathode ray tube (CRT) or liquid crystal display (LCD), to display information to a user. In one embodiment, graphics memory subsystem provides the memory reliability mechanisms as described herein.

Alphanumeric input device 160, including alphanumeric and other keys, may be coupled to bus 105 to communicate information and command selections to processor 110. Another type of user input device is cursor control 170, such as a mouse, a trackball, or cursor direction keys to communicate direction information and command selections to processor 110 and to control cursor movement on display 150.

Electronic system 100 further may include network interface(s) 180 to provide access to a network, such as a local area network. Network interface(s) 180 may include, for example, a wireless network interface having antenna 185, which may represent one or more antenna(e). Network interface(s) 180 may also include, for example, a wired network interface to communicate with remote devices via network cable 187, which may be, for example, an Ethernet cable, a coaxial cable, a fiber optic cable, a serial cable, or a parallel cable.

In one embodiment, network interface(s) 180 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b—1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g—2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

Figure 2:
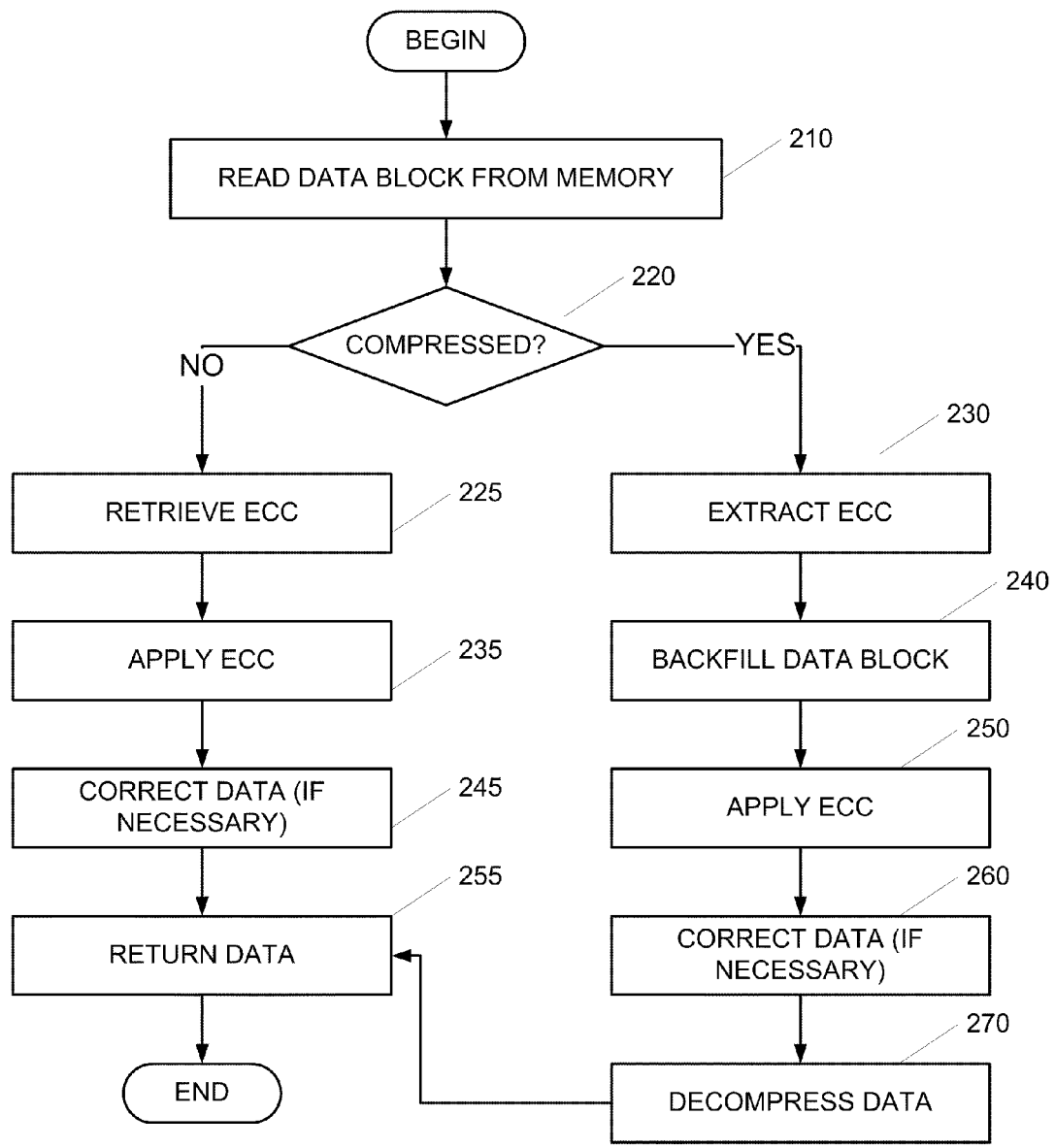
FIG. 2 is a flow diagram of one embodiment of a technique for reading data from memory.

FIG. 2 is a flow diagram of one embodiment of a technique for reading data from memory. In one embodiment, a memory controller device or other control circuitry that provides data to a memory or memory subsystem performs the operations described with respect to FIG. 2. In many situations, memory read operations are of particular importance, as additional latency in delivering data to the requesting agent will have an impact on overall workload performance.

In one embodiment, a memory read transaction request received by memory controller or other component that causes it to request a block of data from memory. The block of data is read from memory, 210. The memory controller determines if the block of data is compressed or not, 220. In one embodiment, the block of data includes a tag or flag or other indicator that is utilized by the memory controller to determine whether the block of data has been compressed. For example, the first bit may be used to indicate whether the data block has been compressed. Other bit locations and/or indicators may also be utilized.

If the block of data is not compressed, the ECC for the uncompressed block of data is retrieved, 225. In on embodiment, the ECC for uncompressed data block are stored in a designated portion of memory that may be separate from the corresponding block of data.

If the data block is compressed, 220, the ECC bits are retrieved, 225. The ECC is applied to the compressed block of data, 235. The data is corrected, if necessary, 245. The compressed and corrected (if necessary) block of data is then returned by the memory controller, 255.

In a second example, the ECC bits will be extracted, the portion of the data block will be backfilled and the block of data will be decompressed. Subsequently, the ECC is applied to the decompressed data, corrected if necessary and returned by the memory controller. These two example implementations provide different levels of ability to correct errors and serve only as examples of the different ECC implementation methodologies.

If the data block is compressed, 220, the ECC bits are extracted, 230. The portion of the data block from which the ECC bits are extracted are backfilled, 240. The backfilling can be any known pattern (e.g., all 1s, all 0s, alternating pattern). The ECC is applied to the compressed and filled block of data, 250. The data is corrected, if necessary, 260. The compressed and corrected (if necessary) block of data is decompressed, 270 and then returned by the memory controller, 280.

Figure 3:
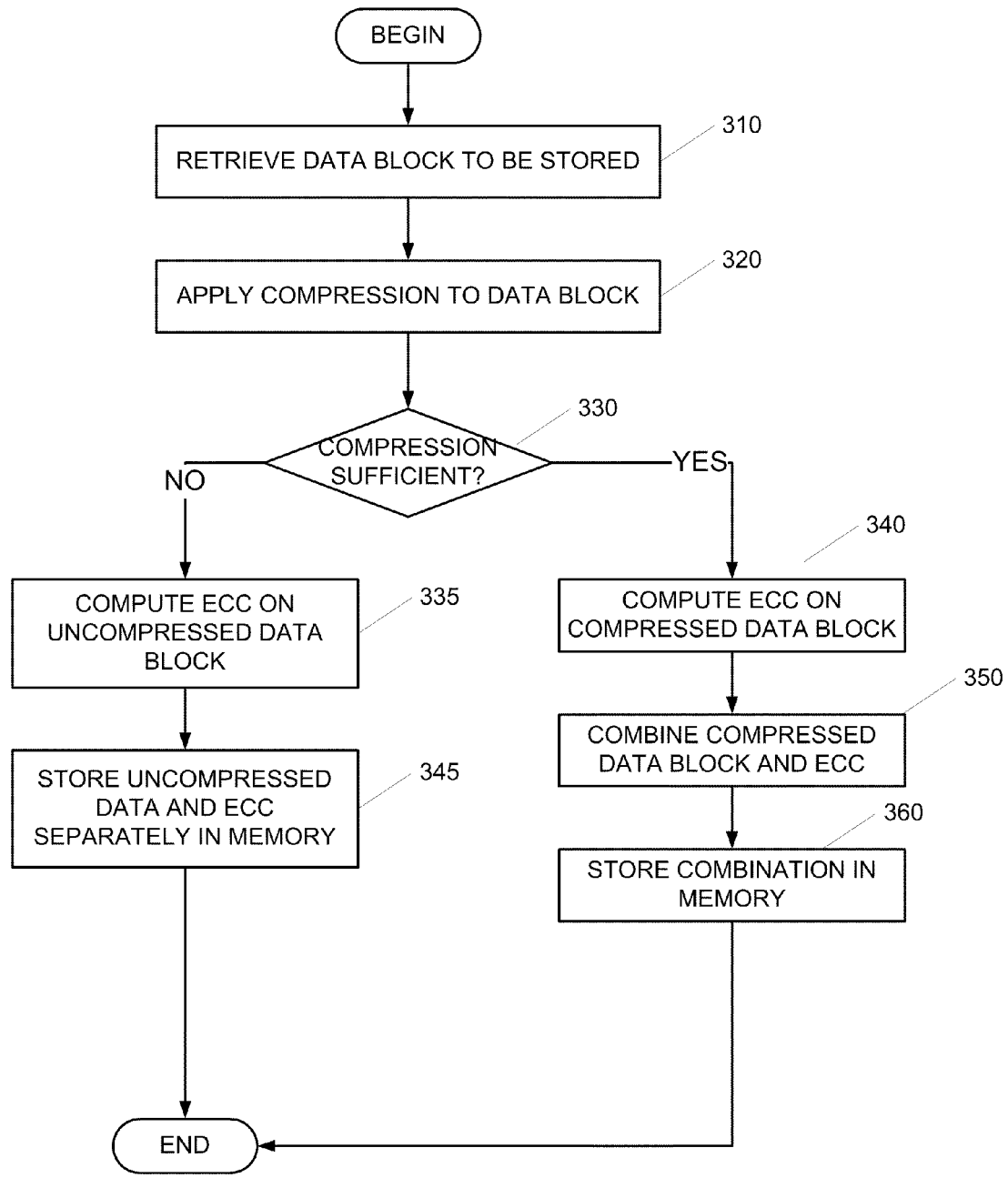
FIG. 3 is a flow diagram of one embodiment of a technique for writing data to memory.

FIG. 3 is a flow diagram of one embodiment of a technique for writing data to memory. In one embodiment, a memory controller device or other control circuitry that provides data to a memory or memory subsystem performs the operations described with respect to FIG. 3. Memory write operations are usually not in the critical path of execution and can tolerate some amount of latency. Thus, the compression can take a bit longer and will not affect performance.

The block of data to be written to memory is received by the memory controller, 310. One or more compression techniques are applied to the block of data, 320. The memory controller evaluates the results of the one or more compression techniques to determine whether the block of data can be compressed enough to accommodate ECC (and possibly other information) in the space of the original block of data, 330.

The compression algorithm and architecture may depend upon the target market, area and power constraints as well as the level of ECC protection desired. The techniques described herein may utilize multiple compression algorithms both individually and in a multi-level design.

Because ECC symbols typically are less than two bytes per memory line, a highly complex compression algorithm may not be necessary but may be balanced against the number of resultant compressible lines. In one embodiment, basic fixed-value symbol and other dictionary-based schemes, where static symbols are enumerated in a table and referenced by indices embedded in the compressed line, yield good performance against most workloads.

In another embodiment, a run-length encoding scheme that indexes repeated symbols in a line also exhibits good performance and combining masks may be utilized to further increase coverage. The validated Single Correct Double Detect ECC implementations that have been evaluated have shown greater than 90% compressible lines across a set of workloads.

If the line is sufficiently compressible, 330, the ECC is computed for the block of data, 340. The ECC may be computed prior to the compression of the data or after the compression step depending on the desired implementation and level of ability to correct errors. In one example, the ECC may be computed on the uncompressed data, the data block would be compressed and the compressed block of data and the corresponding ECC are combined to create a block of data to be stored in memory, 350.

In another example, the data block may be compressed and backfilled with a known pattern with the ECC being computed on the new compressed block of data. The ECC bits then replace the backfilled pattern bit and the combination of the compressed data, ECC and/or other data (e.g., indication of whether the data is compressed) is stored in memory, 360. In one embodiment, the combination of the compressed data, ECC and/or other data includes the same number of bits as the original, uncompressed block of data. In another embodiment, the combination of compressed data, ECC and/or other data includes less than the number of bits of the original, uncompressed data.

If the block of data is not sufficiently compressible, 330, the ECC is computed on the uncompressed block of data, 335. The uncompressed block of data and ECC together with an indication as to whether the data is compressed or not can be considered an "extended line." The extended line is separated into two parts that are stored separately, 345.

In one embodiment, one part has the length of the original, uncompressed block of data and is stored in the original line address. The reminder of the extended line is stored in a separate memory location. Both parts of the extended line are written to memory.

Optionally, as an optimization, local store buffers can be used to buffer the extended part of the uncompressible line. For writes, the local buffers may act as write combine buffers. When writing the extended part of an uncompressed line, each line only occupies a portion of the line and multiple extended parts from consecutive uncompressed lines can be written on the same line before writing back to memory. This amortizes the write back overhead. For reads, the local buffers act as a cache. This eliminates the second read transaction if consecutive uncompressed lines are read sequentially.

Today's traditional solutions involve hardware support in both the memory components and the memory controller. Any new additional error checking capability will require coordination and changes in both components. This solution only requires changes in the memory controller and can be enabled and disabled by the system integrator or the end user.

FIG. 4 is a conceptual diagram of one embodiment of a compressible memory line. In one embodiment the memory line may include pointer 410 to indicate the beginning of the compressed data included in memory line 400. Memory line 400 further includes ECC bits 420 that are used for error correction of compressed data bits 440, 450, etc.

FIG. 5 is a conceptual diagram of one embodiment of an uncompressible memory line. The example of FIG. 5 provides example field sizes for one embodiment of the technique described herein; alternate field sizes are also supported. In one embodiment the memory line may include tag 510 to indicate that data line 500 is uncompressed. In one embodiment, displaced data from the first portion of data line 500 is stored in a shadow memory location. In one embodiment the first 16 bits of the uncompressed data is stored in the shadow memory location; however, other data segment sizes may be used. Memory line 500 further includes ECC bits 520 that are used for error correction of uncompressed data bits 540.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
receiving a N-bit uncompressed data to be stored in a memory device, wherein the memory device does not perform any error correction code (ECC) algorithm nor provide designated error correction code storage for the N-bit uncompressed data, where N is a positive integer;
compressing the N-bit uncompressed data to generate a M-bit compressed data, where M is a positive integer;
determining whether the M-bit compressed data can be stored with K corresponding ECC bits within a N-bit storage location, where K is a positive integer;
computing a K-bit ECC for the M-bit compressed data, wherein M+K is less than or equal to N if M+K is equal to or less than N;
storing the M-bit compressed data and the K-bit ECC together in the memory device within a selected storage location that is equal to or less than N bits if M+K is equal to or less than N; and
storing the N-bit uncompressed data in uncompressed form if M+K is greater than N.

2. The method of claim 1 further comprising:
determining if the data compression provides less than K bits of compression;
applying ECC to the N-bit uncompressed data if the data compression provides less than K bits of compression to generate a K-bit ECC for the N-bit uncompressed data; and
storing the N-bit uncompressed data and the K-bit ECC in memory.

3. The method of claim 1 wherein data stored in memory includes at least a tag bit indicating whether an associated block of data is compressed.

4. The method of claim 1 further comprising:
reading a N-bit block of data from the memory device;
determining whether the N-bit block of data from the memory device is compressed data with associated ECC bits, or if the N-bit block of data is uncompressed data;
if the N-bit block of data from the memory is uncompressed data, generating an output signal representing the uncompressed data;
if the N-bit block of data from the memory device is compressed data with associated ECC bits,
separating the ECC bits from the compressed data,
decompressing the compressed data,
correcting the decompressed data utilizing the ECC bits, if necessary, and
generating an output signal representing the decompressed data.

5. The method of claim 4 wherein the N-bit block of data from the memory device comprising the compressed data with the associated ECC bits comprises:
a M-bit block of compressed data; and
a K-bit ECC;
wherein M+K is less than or equal to N.

6. The method of claim 1 wherein the N-bit block of data comprises graphics data.

7. An apparatus comprising:
a memory controller to compress the N-bit uncompressed data to generate a M-bit compressed data, where M is a positive integer, determining whether the M-bit compressed data can be stored with K corresponding error correcting code (ECC) bits within a N-bit storage location, where K is a positive integer, computing a K-bit ECC for the M-bit compressed data, wherein M+K is less than or equal to N if M+K is equal to or less than N, store the M-bit compressed data and the K-bit ECC together in the memory device within a selected storage location that is equal to or less than N bits if M+K is equal to or less than N, and store the N-bit uncompressed data in uncompressed form if M+K is greater than N.

8. The apparatus of claim 7 wherein the memory device does not provide designated error correction code storage for the N-bit uncompressed data.

9. The apparatus of claim 7, wherein the M-bit compressed data and the K-bit ECC are stored together in a N-bit memory location.

10. The apparatus of claim 7, wherein the memory controller determines if the data compression provides less than K bits of compression.

11. The apparatus of claim 10 wherein the memory controller applies ECC to the uncompressed data if the data compression provides less than K bits of compression to generate a K-bit ECC for the uncompressed data.

12. The apparatus of claim 7 wherein data stored in memory includes at least a tag bit indicating whether an associated block of data is compressed.

13. The apparatus of claim 11 wherein the N-bit uncompressed data from the memory device comprising the compressed data with the associated ECC bits comprises:
a M-bit block of compressed data; and
a K-bit ECC;
wherein M+K is less than or equal to N.

14. The apparatus of claim 7 wherein the N-bit uncompressed data comprises graphics data.

* * * * *